United States Patent [19]

Bigelow

[11] Patent Number: 4,657,629
[45] Date of Patent: Apr. 14, 1987

[54] BILEVEL RESIST PROCESS

[75] Inventor: Mark G. Bigelow, Palm Bay, Fla.

[73] Assignee: Harris Corporation, Melbourne, Fla.

[21] Appl. No.: 844,504

[22] Filed: Mar. 27, 1986

[51] Int. Cl.⁴ .................... H01L 21/306; B44C 1/22; C03C 15/00; B29C 37/00

[52] U.S. Cl. .................................. 156/643; 156/646; 156/652; 156/653; 156/644; 156/657; 156/661.1; 156/662; 156/668; 156/904; 427/43.1; 430/312; 430/313; 430/317; 204/192.32

[58] Field of Search ............... 156/643, 644, 646, 652, 156/653, 657, 659.1, 661.1, 662, 668, 904; 430/312, 313, 317; 427/38, 39, 43.1; 252/79.1; 204/192 E

[56] References Cited

U.S. PATENT DOCUMENTS 4,201,800  5/1980  Alcorn et al. ............... 156/661.1 X
4,434,224  2/1984  Yoshikawa et al. ............ 430/323
4,599,137  7/1986  Akiya ........................ 156/652 X Primary Examiner—William A. Powell
Attorney, Agent, or Firm—Antonelli, Terry & Wands

[57] ABSTRACT

A bilevel photoresist process employs a first relatively thick photoresist layer deposited over the surface to be patterned. The entirety of this first photoresist layer is exposed to actinic ultraviolet radiation and thereafter subjected to a heat treatment so as to effectively desensitize the layer to the action of a developing agent. Patterning of this first layer is accomplished by depositing a second, relatively thin photoresist layer on the effectively planarized surface of the first layer, selectively exposing the second layer to a mask pattern to be used for patterning the underlying semiconductor structure and thereafter developing the second layer of photoresist. Because of its thickness the first layer effectively acts as an optical buffer between the second relatively thin layer and any underlying metallic reflective interface, so that optical notching of the second layer of photoresist cannot occur. In addition, because the first layer has been completely desensitized to photodeveloping agents, etching through the second layer terminates at the top surface of the first layer. Following patterning of the second photoresist layer, the bilevel photoresist structure is exposed to a reactive ion etch (RIE) which effectively maps the aperture pattern of the second photoresist layer into and through the first photoresist layer.

17 Claims, 6 Drawing Figures

BILEVEL RESIST PROCESS

FIELD OF THE INVENTION

The present invention relates in general to semiconductor manufacturing and, in particular, to a process for forming a patterned mask layer through which underlying semiconductor material (e.g. substrate, dielectric, interconnect) is selectively etched.

BACKGROUND OF THE INVENTION

A continuing objective of integrated circuit designs in closer spacing (higher integration density) of the respective components of which a circuit configuration is made, in order to increase signal processing speed and occupation area per wafer (more circuits per chip). To meet this objective, semiconductor processing engineers have continued to refine wafer processing methodologies, particularly the patterning techniques through which individual regions of the semiconductor structure are defined. In order to pack a larger number of components in the semiconductor structure, integrated circuit configurations have evolved into complex three dimensional topographies comprised of the wafer material itself (e.g. silicon, gallium arsenide) and a multilevel dielectric (e.g. silicon dioxide, phosphosilicate glass)/interconnect (e.g. aluminum, gold doped polysilicon) overlay.

For realizing an intended structural configuration, the respective layers of which the integrated circuit is made are selectively patterned, typically employing a series of mask and etch steps. In accordance with such processing, one or more layers of material to be patterned (selectively removed) is covered with a relatively thin layer (on the order of 15,000 Å) of photoresist. Selected areas of the photoresist layer that are to serve as apertures for etching the underlying structure are exposed to light through a photoresist mask. The photoresist is developed and washed to remove those portions of the photoresist layer that had not been masked. It is through these apertures in the photoresist layer that the underlying semiconductor structure is removed (etched). While this process has been generally adequate for relatively simple integrated circuit topographies, it has been found to entail a number of shortcomings when applied to very narrow line width (on the order of two micron or less), undulating multilevel semiconductor structures (e.g. high complexity very high speed integrated circuit topographies).

More particularly, where the material underlying the photoresist is highly reflective (e.g. a metallic interconnect layer of gold or aluminum) the light which passes into an intended region of the photoresist through the mask may reflect off the underlying reflective interface and travel through portions of the photoresist layer not intended to be activated by the light. This is particularly true where the reflective interface is not normal to the direction of incidence of the light beam. For a relatively thin layer of photoresist the reflected light may contain sufficient energy to effectively enlarge the size of the intended aperture, creating what is termed "reflective notching" of the photoresist layer.

Another problem in using a thin layer of photoresist is its inability to provide adequate step coverage. Namely, at sharply sloped portions of the underlying semiconductor structure the thickness of the photoresist may be significantly decreased or tapered relative to other portions. As a result, during its subsequent use as an etchant mask for removing underlying material exposed by the apertures in the photoresist mask, (during which time the photoresist is also attacked by the etchant) these relatively thin portions may be completely removed, thereby exposing previously masked surface areas of the underlying structure to the etchant.

A further disadvantage of the poor step coverage provided by a thin photoresist layer is the substantial height differential of respective areas of the three dimensional surface of the resulting topography. This height differential (which may be on the order of two to four microns) is often larger than the depth of focus of the imaging optics of the photolithographic equipment employed to selectively expose the photoresist layer. As a result, an imprecise image is created on the photoresist layer.

In an attempt to obviate the above-described problems of conventional single layer photoresist processing, a number of multi-layer masking techniques have been proposed. These include incorporating multiple layers of different compositions (e.g. photoresist-glass-polymer, metallic inner layers, as described for example in Fraser et al U.S. Pat. No. 4,244,799 and Griffing U.S. Pat. No. 4,362,598) or thickening the layer of photoresist in an attempt to planarize its top surface (as described for example in Horst et al U.S. Pat. No. 3,873,313, White et al U.S. Pat. No. 4,427,713 and Reichmanis et al U.S. Pat. No. 4,481,049). Unfortunately these proposals are either complicated from a standpoint of the use of diverse materials or they constitute only a partial solution to the problem. For example, thickening the photoresist layer, per se, as proposed by the White et al U.S. Pat. No. 4,427,713, while improving step coverage, does not eliminate the notching problem; the thicker photoresist layer is still effectively patterned using a conventional exposure and etch process for etching a top resist mask, creating the problem of undercutting and enlarging the apertured portion of the thick photoresist layer.

SUMMARY OF THE INVENTION

In accordance with the present invention, the above-enumerated shortcomings of conventional photolithographic patterning techniques are circumvented by a bilevel or dual photoresist processing methodology which is capable of providing patterning resolution to submicron line widths. Pursuant to the present invention, in place of a single relatively thin photoresist layer, patterning of a semiconductor structure of interest is achieved by depositing a first relatively thick (on the order of 1.5–2.0 microns) photoresist layer over the surface to be patterned. The entirety of this first photoresist layer is exposed to actinic ultraviolet radiation and thereafter subjected to a heat treatment so as to effectively desensitize the layer to the action of a developing agent. Because of the considerable thickness of this first layer, its surface is effectively planarized, thereby providing good step coverage and ensuring capability with the depth of focus limitations of the photolithographic optics to be used for patterning this first relative thick layer. Patterning of this first layer is accomplished by depositing a second relatively thin (e.g. 0.7 microns) photoresist layer on the effectively planarized surface of the first layer, selectively exposing the second layer to a mask pattern to be used for patterning the underlying semiconductor structure and thereafter developing the second layer of photoresist.

Because of its thickness the first layer effectively acts as an optical buffer between the second relatively thin layer and any underlying metallic reflective interface, so that optical notching of the second layer of photoresist cannot occur. In addition, because the first layer has been completely desensitized to photodeveloping agents, etching through the second layer terminates at the top surface of the first layer.

Following patterning of the second photoresist layer, the bilevel photoresist structure is exposed to a reactive ion etch (RIE) which effectively maps the aperture pattern of the second photoresist layer into and through the first photoresist layer. The first thick layer may be treated prior to deposition of the second photoresist layer, to cause the first layer to be etched by the RIE process at a rate faster than the overlying second photoresist layer, thereby ensuring complete etching through the first layer before the second photolithographically patterned layer has been totally eroded by the reactive ion etch.

DETAILED DESCRIPTION

Referring now to FIGS. 1-6 of the drawings, the respective steps of the bilevel photoresist processing methodology of the present invention will be described.

Figure 1:
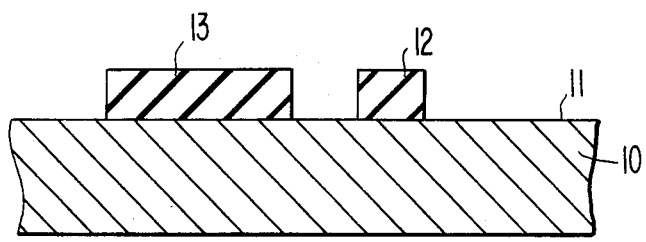
FIGS. 1-6 are respective diagrammatic views of a semiconductor structure during successive steps of forming a patterning mask in accordance with the bilevel photoresist of the present invention.

FIG. 1 shows an exemplary semiconductor structure on which a patterning mask is to be formed. In order to simplify the drawings, the structure has been illustrated as comprising a silicon substrate 10 on a planar surface 11 of which a previously patterned layer 12 of silicon dioxide has been formed. Substrate 10 may include one or more regions of different conductivity types forming respective circuit elements in the substrate. A description of the details of the internal region of the substrate 10 is unnecessary for an understanding of the present invention and will not be described here. It should also be understood that the undulating topology on the top surface 11 of the substrate 10 may comprise one or more layers of dielectric and interconnect metal. Only a single layer of dielectric (silicon dioxide) 12 has been illustrated in order to simplify the drawings. As is the case with the internal configuration of the substrate 10, a description of the constituency and configuration of any overlying dielectric/interconnect layer structure is unnecessary for an understanding of the present invention.

Figure 2:
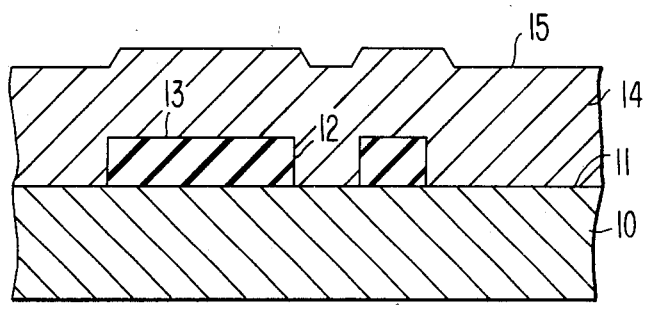

Referring now to FIG. 2, in accordance with the first processing step of the present invention, the structure of FIG. 1 on which the patterning layer is to be formed is initially coated with a single layer of photoresist 14, such as a layer of MacDermid PR914, having a thickness on the order of 1.5-2.0 microns. Photoresist layer 14 is preferably spin coated so as to effectively completely cover the underlying semiconductor structure and effectively planarize the top surface 15. It is then subjected to a hot plate bake (e.g. at 110° C. for sixty seconds).

Figure 3:
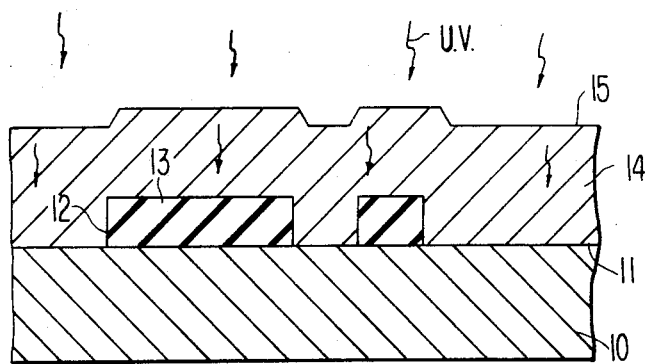

Next, as shown in FIG. 3, the entire surface 15 of photoresist layer 14 is exposed to actinic ultra-violet radiation U.V. at a prescribed energy density (e.g. 10 mJ/cms$^2$) and time sufficient to completely expose the entirety of the thickness of layer 14. The structure is then heated, for example in a nitrogen atmosphere at a temperature on the order 140° C. for approximately 30 minutes, whereby photoresist layer 14 is completely desensitized to a developer agent.

Figure 4:
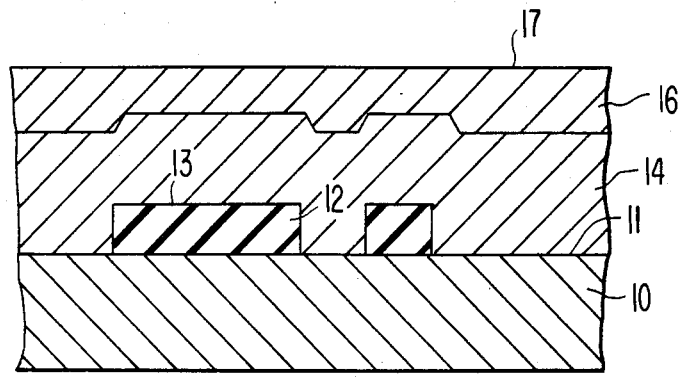

Next, as shown in FIG. 4, a second layer 16 of photoresist, which may comprise the same material as the first, such as the above mentioned MacDermid PR 914. The coating of the second layer on the first may again be accomplished by a conventional spin coat process followed by a heat treatment, for example at the above mentioned processing parameters of 110° C. for approximately 60 seconds, thereby resulting in an effectively planar surface 17 for the second layer 16 atop the first layer 14. The thickness of the second layer is on the order of 1.0 to 1.5 microns.

Figure 5:
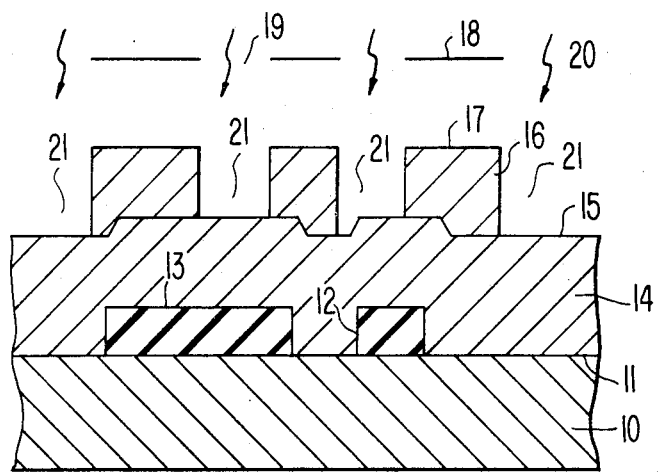

Following this step, as shown in FIG. 5, the top layer of photoresist 16 is exposed to ultraviolet radiation 20 through a photolithographic mask element 18 having an aperture pattern 19 therein to expose projected regions 21. A developer agent such as MF-60 manufactured by MacDermid is then applied nonselectively to the entire surface of layer 16 to result in an aperture pattern which extends through layer 16 down to the top surface 15 of underlying desensitized thick photoresist layer 14.

As mentioned above, because layer 14 has been completely desensitized and is relatively thick, ultraviolet radiation 20, which enters layer 16 through the apertures 19 in mask 18 and is incident upon layer 14, is effectively completely absorbed by layer 14, so that there is no returned energy reflecting off any underlying surface of the semiconductor structure to enlarge the apertures 21 in layer 16. In addition, because of its substantial thickness, layer 14 provides good step coverage over the entire surface of the semiconductor structure therebeneath and results in a shape of surface 15 that falls within the depth of focus window of the present day photolithographic equipment. Namely, over the entire surface 15 of the first relatively thick photoresist layer 14, the differential 1 and thickness of photoresist layer 16 falls within the depth of focus of the photolithographic optics.

Following the patterning of the second photoresist layer 16, the entire structure is subjected to a reactive ion etch, such as one employing an oxygen plazma at low pressure (on the order of 10 to 50 milliTorr). This etching step etches both the top photoresist layer 16 and the underlying thick photoresist layer 14. In effect, it transfers the aperture pattern 21 in the top photoresist layer 16 into the thick photoresist layer 14 therebeneath. To ensure complete etching of the pattern in the underlying thick photoresist layer 14, layer 14 or layer 16 may be individually treated such as by a conventional DEEP DV process, so that the etch rate of the overlying thin photoresist layer 16 is slower than that of the underlying layer 14 during the reactive ion etch step.

Figure 6:
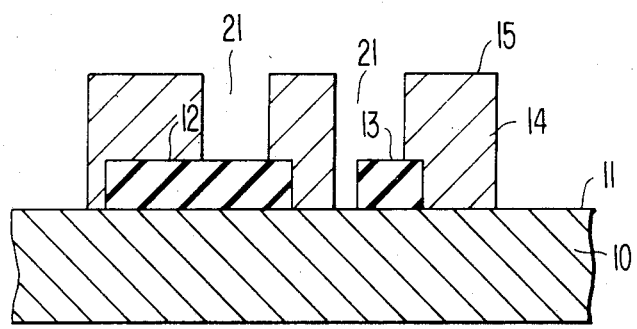

Following complete etching through of the pattern 21 into the underlying layer 14, as shown in FIG. 6, the semiconductor structure is ready for further processing. For example, if polysilicon had been deposited over the silicon dioxide/silicon structure shown in FIG. 1, the polysilicon may now be an isotropically etched through the aperture pattern 21 in the photoresist layer 14 to achieve critical dimensional control and vertical polysilicon side walls. Namely, because photoresist layer 14 has a substantial thickness, it is possible to provide an aspect ratio for the aperture pattern 21 in excess of one, thereby enabling a reduction in line width to submicrons dimensions.

In the foregoing description of the invention, each of photoresist layers 14 and 16 was described as comprising the same material, thereby simplifying the process. However, it should be observed that different materials may be employed. What is important is that the characteristics of the layer 14 which are formed over the semiconductor structure and which will be employed as the basic patterning layer for the underlying structure be relatively thick so as to be effectively self-planarized and be completely desensitized so that it is unaffected by the patterning and developing process of the second photoresist layer formed thereon. In other words, it is the first underlying thick layer which is to be employed for patterning the semiconductor structure therebeneath and it is the second level of photoresist atop the first relatively thick layer which is used to pattern that layer itself.

While I have shown and described an embodiment in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

What is claimed:

1. For use in a process for manufacturing a semiconductor device, a method of forming a masking layer on an underlying semiconductor structure to be selectively patterned through apertures in said masking layer comprising the steps of:
   (a) forming a first layer of photoresist material on said semiconductor structure;
   (b) desensitizing said first layer of photoresist material to the action of developing agent;
   (c) forming a second layer of photoresist material on said first layer of desensitized photoresist material;
   (d) photolithographically patterning said second layer of photoresist material so as to expose prescribed surface portions of said first desensitized layer of photoresist material; and
   (e) removing from said first layer desensitized photoresist material portions beneath said prescribed surface portions.

2. A method according to claim 1, wherein step (e) comprises the step of etching said exposed prescribed surface portions of said first layer of desensitized photoresist material using said second layer of photolithographically patterned photoresist material as a mask thereof.

3. A method according to claim 1, wherein step (e) comprises exposing the photoresist layer structure resulting from step (d) to a nonselective etching medium.

4. A method according to claim 1, wherein step (e) comprises exposing the photoresist layer structure resulting from step (d) to a reactive ion etch.

5. A method according to claim 1, wherein step (b) comprises exposing the entirety of said first layer of photoresist material to electromagnetic radiation and heating said first layer to thereby effectively desensitize first layer to the action of a developing agent.

6. A method according to claim 5, wherein step (e) comprises the step of etching said exposed prescribed surface portions of said first layer of desensitized photoresist material using said second layer of photolithographically patterned photoresist material as a mask thereof.

7. A method according to claim 5, wherein step (e) comprises exposing the photoresist layer structure resulting from step (d) to a reactive ion etch.

8. A method according to claim 1, wherein the thickness of said first layer of photoresist material is on the order of at least twice the thickness of said second layer of photoresist material.

9. A method according to claim 1, wherein each of said first and second layers of photoresist material is comprised of the same photoresist material.

10. A method according to claim 1, wherein the thickness of said first layer of photoresist material is such that the top surface of said first layer is substantially planarized.

11. A method according to claim 10, wherein step (b) comprises exposing the entirety of said first layer of photoresist material to electromagnetic radiation and heating said first layer to thereby effectively desensitize first layer to the action of a developing agent.

12. A method according to claim 5, wherein step (e) comprises exposing the photoresist layer structure resulting from step (d) to a reactive ion etch.

13. A method according to claim 12, wherein each of said first and second layers of photoresist material is comprised of the same photoresist material.

14. A method according to claim 13, wherein the thickness of said first layer of photoresist material is on the order of at least twice the thickness of said second layer of photoresist material.

15. A method according to claim 1, further including the step of (f), prior to step (e), treating one of said first and second photoresist layers to cause said layers to be etched at respectively different etching rates by a prescribed etching medium, and step (e) comprises exposing the photoresist layer structure resulting from step (d) to said etching medium.

16. A method according to claim 15, wherein step (e) comprises exposing the photoresist layer structure resulting from step (d) to a reactive ion etch.

17. A method according to claim 16, wherein step (b) comprises exposing the entirety of said first layer of photoresist material to electromagnetic radiation and heating said first layer to thereby effectively desensitize first layer to the action of a developing agent.

* * * * *